US012772441B2

(12) United States Patent
Yu et al.

(10) Patent No.: US 12,772,441 B2
(45) Date of Patent: Oct. 20, 2026

(54) MEMORY DEVICE AND METHOD OF FABRICATING THE SAME

(71) Applicant: Winbond Electronics Corp., Taichung City (TW)

(72) Inventors: Shuo-Ting Yu, Tainan City (TW); Hsuan-Tung Chu, Tainan City (TW); Wei-Che Chang, Taichung City (TW)

(73) Assignee: Winbond Electronics Corp., Taichung City (TW)

(*) Notice: Subject to any disclaimer, the term of this patent is extended or adjusted under 35 U.S.C. 154(b) by 303 days.

(21) Appl. No.: 18/779,103

(22) Filed: Jul. 22, 2024

(65) Prior Publication Data

US 2025/0311198 A1 Oct. 2, 2025

(30) Foreign Application Priority Data

Apr. 1, 2024 (TW) ................................ 113112414

(51) Int. Cl.

*H10B 12/00* (2023.01)
*G11C 5/06* (2006.01)

(52) U.S. Cl.

CPC ........... *H10B 12/482* (2023.02); *G11C 5/063* (2013.01); *H10B 12/02* (2023.02); *H10B 12/488* (2023.02); *H10B 12/50* (2023.02)

(58) Field of Classification Search

CPC .............................. H10B 12/482; H10B 12/50
See application file for complete search history.

(56) References Cited

U.S. PATENT DOCUMENTS 10,756,113 B2 * 8/2020 Huo ...................... H10B 43/50
11,264,323 B2 * 3/2022 Huang ................. H10B 12/033
11,404,442 B2 8/2022 Huo et al.
11,562,958 B2 1/2023 Huang
(Continued)

FOREIGN PATENT DOCUMENTS

TW 201926651 7/2019
TW 202115830 4/2021
(Continued)

OTHER PUBLICATIONS

"Office Action of Taiwan Counterpart Application", issued on Jan. 17, 2025, with English translation thereof, p. 1-p. 10.
(Continued)

*Primary Examiner* — Steven M Page
(74) *Attorney, Agent, or Firm* — JCIPRNET

(57) ABSTRACT

A memory device includes a substrate, word line structures, bit line structures, dummy bit line structures, partition walls, and conductive plugs. The bit line structures are disposed above the substrate and extend from the array region to a transition region in the substrate. The dummy bit line structures are disposed in the transition region in the substrate, adjacent to the bit line structures, and extending along the second direction. The partition walls are disposed above the bit line structures and the dummy bit line structures, extending along the first direction. The conductive plugs are located in the transition region in the substrate. Each of the conductive plugs is located between two adjacent ones of the dummy bit line structures, and extends through the partition walls, and is electrically connected to one of the word line structures.

18 Claims, 9 Drawing Sheets

(56) References Cited

U.S. PATENT DOCUMENTS

| | | | | |
|---|---|---|---|---|
| 12,482,699 | B2 * | 11/2025 | Kim | H10B 12/053 |
| 2013/0256769 | A1 * | 10/2013 | Jeong | H10B 12/033 257/296 |
| 2021/0082924 | A1 * | 3/2021 | Seong | H10B 12/315 |
| 2022/0189968 | A1 * | 6/2022 | Park | H10B 12/053 |
| 2022/0359528 | A1 * | 11/2022 | Zhang | H10B 12/056 |

FOREIGN PATENT DOCUMENTS

| | | |
|---|---|---|
| TW | 202345298 | 11/2023 |
| TW | 202347717 | 12/2023 |

OTHER PUBLICATIONS

"Notice of Allowance of Taiwan Counterpart Application", issued on Feb. 27, 2025, with English translation thereof, p. 1-p. 4.

* cited by examiner

MEMORY DEVICE AND METHOD OF FABRICATING THE SAME

CROSS-REFERENCE TO RELATED APPLICATION

This application claims the priority benefit of Taiwan application serial no. 113112414, filed on Apr. 1, 2024. The entirety of the above-mentioned patent application is hereby incorporated by reference herein and made a part of this specification.

BACKGROUND

Technical Field

The disclosure relates to an integrated circuit and a fabricating method thereof, and in particular to a memory device and a fabricating method thereof.

Description of Related Art

With the rapid advancement of technology, in order to meet consumer demand for compact electronic devices, the size of memory designs continues to shrink and develop towards high integration. However, as the size of elements continues to shrink, the spacing between elements or components also becomes smaller, thus leading to greater difficulties and challenges in the manufacturing process.

SUMMARY

The disclosure provides a memory device and a fabricating method thereof that can avoid excessive expansion of conductive plug openings during a cleaning process, resulting in abnormal bridging between adjacent conductive plugs.

A memory device according to an embodiment of the disclosure includes a substrate, multiple word line structures, multiple bit line structures, multiple dummy bit line structures, multiple partition walls, and multiple conductive plugs. The substrate includes an array region, a peripheral region, and a transition region. The transition region is located between the array region and the peripheral region. The word line structures are disposed in the substrate and extend along a first direction from the array region to the transition region. The bit line structures are disposed above the substrate and extend along a second direction from the array region to the transition region. The dummy bit line structures are disposed above the substrate in the transition region, adjacent to the bit line structures, extending along the second direction. The partition walls are disposed above the bit line structures and the dummy bit line structures, extending along the first direction from the array region to the transition region. The conductive plugs are located in the transition region. Each of the conductive plugs is located between two adjacent ones of the dummy bit line structures, extends through the partition walls, and is electrically connected to one of the word line structures.

The memory device according to an embodiment of the disclosure includes the substrate, the word line structures, the bit line structures, the partition walls, the dummy partition walls, and the conductive plugs. The substrate includes the array region, the peripheral region, and the transition region. The transition region is located between the array region and the peripheral region. The word line structures are disposed in the substrate and extend along the first direction from the array region to the transition region. A dielectric layer is disposed above the substrate. The bit line structures are disposed in the dielectric layer and extend along the second direction from the array region to the transition region. The partition walls are disposed above the bit line structures and in the dielectric layer, extending along the first direction from the array region to the transition region. The dummy partition walls extend along the first direction, cover ends of the bit line structures, and are located in the dielectric layer. The conductive plugs are located between the adjacent dummy partition walls. Each of the conductive plugs is electrically connected to one of the bit line structures.

A method of fabricating a memory device according to an embodiment of the disclosure includes the following steps. The substrate is provided. The substrate includes the array region, the peripheral region, and the transition region, and the transition region is located between the array region and the peripheral region. The word line structures is formed in the substrate. The word line structures extends along the first direction from the array region to the transition region. The dielectric layer is formed on the substrate. The bit line structures are formed in the dielectric layer. The bit line structures extend along the second direction from the array region to the transition region. The partition walls are formed above the bit line structures and in the dielectric layer. The partition walls extend along the first direction from the array region to the transition region. The dummy partition walls are formed in the dielectric layer. The dummy partition walls extend along the first direction and cover at least ends of the bit line structures. The conductive plug openings are formed in the dielectric layer between the adjacent dummy partition walls. The conductive plugs are formed in the conductive plug openings. Each of the conductive plugs is electrically connected to one of the bit line structures.

Based on the above, the memory device of the embodiment of the disclosure can prevent the conductive plug opening from excessive expansion during the cleaning process and avoid abnormal bridging between the adjacent conductive plugs.

DESCRIPTION OF THE EMBODIMENTS

Figure 1:
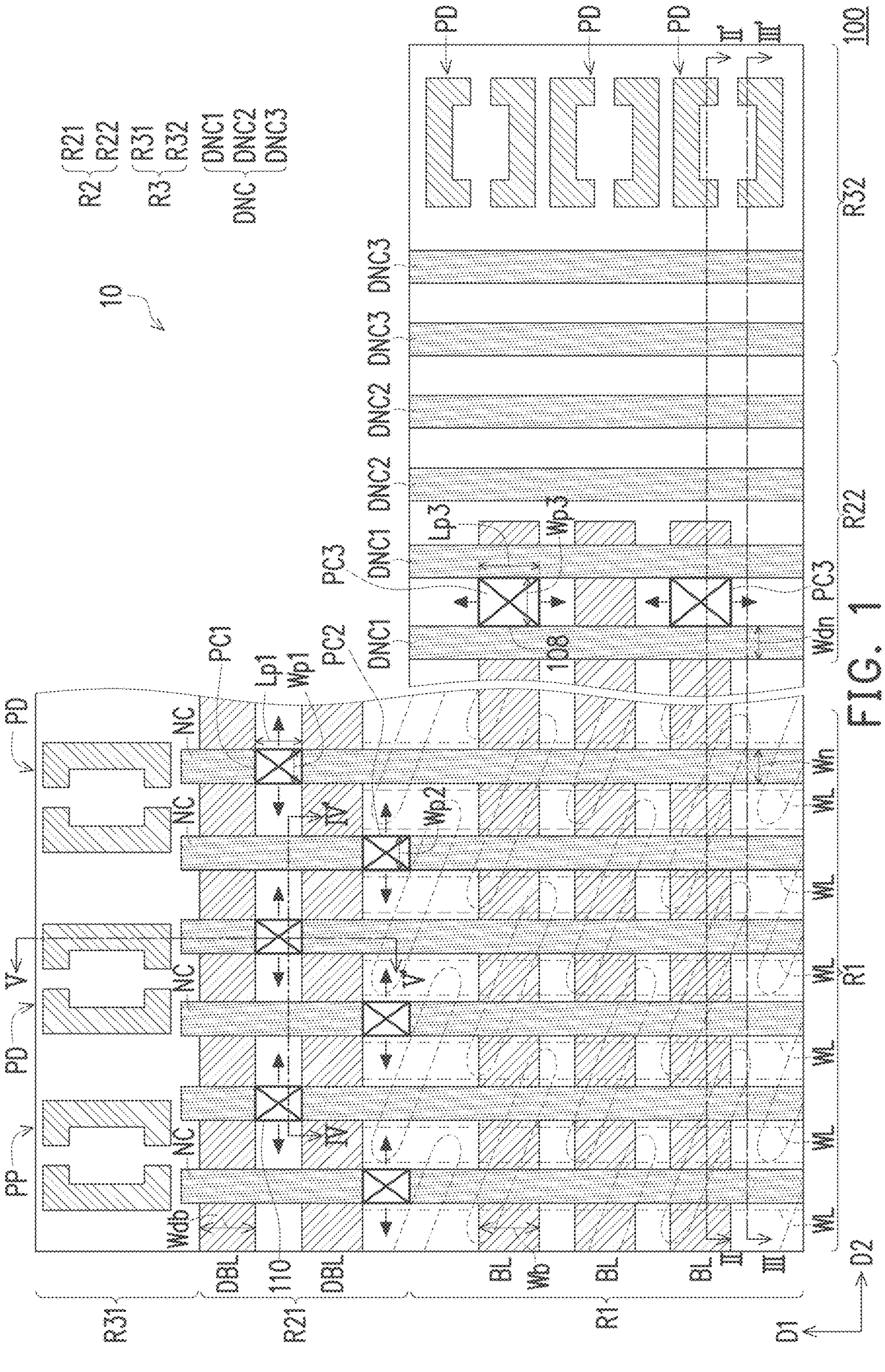
FIG. 1 is a partial top view of a memory device according to an embodiment of the disclosure.

Referring to FIG. 1, a memory device 10 according to an embodiment of the disclosure is formed on a substrate 100. The memory device 10 may be a dynamic random access memory. The substrate 100 includes a semiconductor, such as silicon. The substrate 100 includes an array region R1, a peripheral region R3, and a transition region R2. The transition region R2 is located between the array region R1 and the peripheral region R3. For the sake of clarity, the peripheral region R3 and the transition region R2 in a direction D1 are labeled as a peripheral region R31 and a transition region R21; the peripheral region R3 and the transition region R2 in a direction D2 are labeled as a peripheral region R32 and a transition region R22.

Referring to FIGS. 1 to 5, the memory device 10 includes multiple word line structures WL located in the array region R1 and the transition region R2, multiple bit line structures BL, and multiple peripheral devices PD located in the peripheral region R3. The word line structures WL are embedded in the substrate 100 and extend along the direction D1 from the array region R1 to the transition region R21. The bit line structures BL are disposed above the substrate 100 and extend along the direction D2 from the array region R1 to the transition region R22.

Referring to FIG. 1, the memory device 10 further includes multiple dummy bit line structures DBL extending along the direction D2. The dummy bit line structures DBL are disposed above the substrate 100 of the transition region R21, between the bit line structures BL and the peripheral devices PD, and adjacent to the bit line structures BL. A composition structure of the dummy bit line structures DBL is the same as the composition structure of the bit line structures BL. A width Wdb of the dummy bit line structures DBL may be the same or substantially the same as a width Wb of the bit line structures BL. The number of the dummy bit line structures DBL between the bit line structure BL and the peripheral device PD may be 2 or more.

Referring to FIG. 1, the memory device 10 further includes multiple partition walls NC and multiple dummy partition walls DNC. The partition walls NC are disposed above the bit line structures BL and the dummy bit line structures DBL, extending along the direction D1 from the array region R1 to the transition region R21.

Referring to FIG. 1, the dummy partition walls DNC extend along the direction D1 and are disposed in the array region R1 and the transition region R22. In other embodiments, the dummy partition walls DNC are disposed in the transition region R22 and the peripheral region R32. For example, multiple first dummy partition walls DNC1 of the dummy partition walls DNC are disposed in the transition region R22 and cover multiple ends of the bit line structures BL. Multiple second dummy partition walls DNC2 of the dummy partition walls DNC are disposed in the transition region R22, and above an isolation structure 101 (shown in FIGS. 2 and 3) between the first dummy partition walls DNC1 and the peripheral devices PD of and the peripheral region R32. Multiple third dummy partition walls DNC3 of the dummy partition walls DNC are disposed in the peripheral region R32 adjacent to the transition region R22, between the second dummy partition walls DNC2 and the peripheral devices PD of the peripheral region R32. A material of the dummy partition walls DNC may be the same as a material of the partition walls NC and different from a material of a dielectric layer 103 (shown in FIGS. 2 and 3). The materials of the partition walls NC and the dummy partition walls DNC may be the same as stop layers 104 and 105 (shown in FIGS. 2 and 3). The partition walls NC and the dummy partition walls DNC include insulating materials, such as silicon nitride. A width Wdn of the dummy partition walls DNC may be the same or substantially the same as a width Wn of the partition walls NC.

Figure 2:
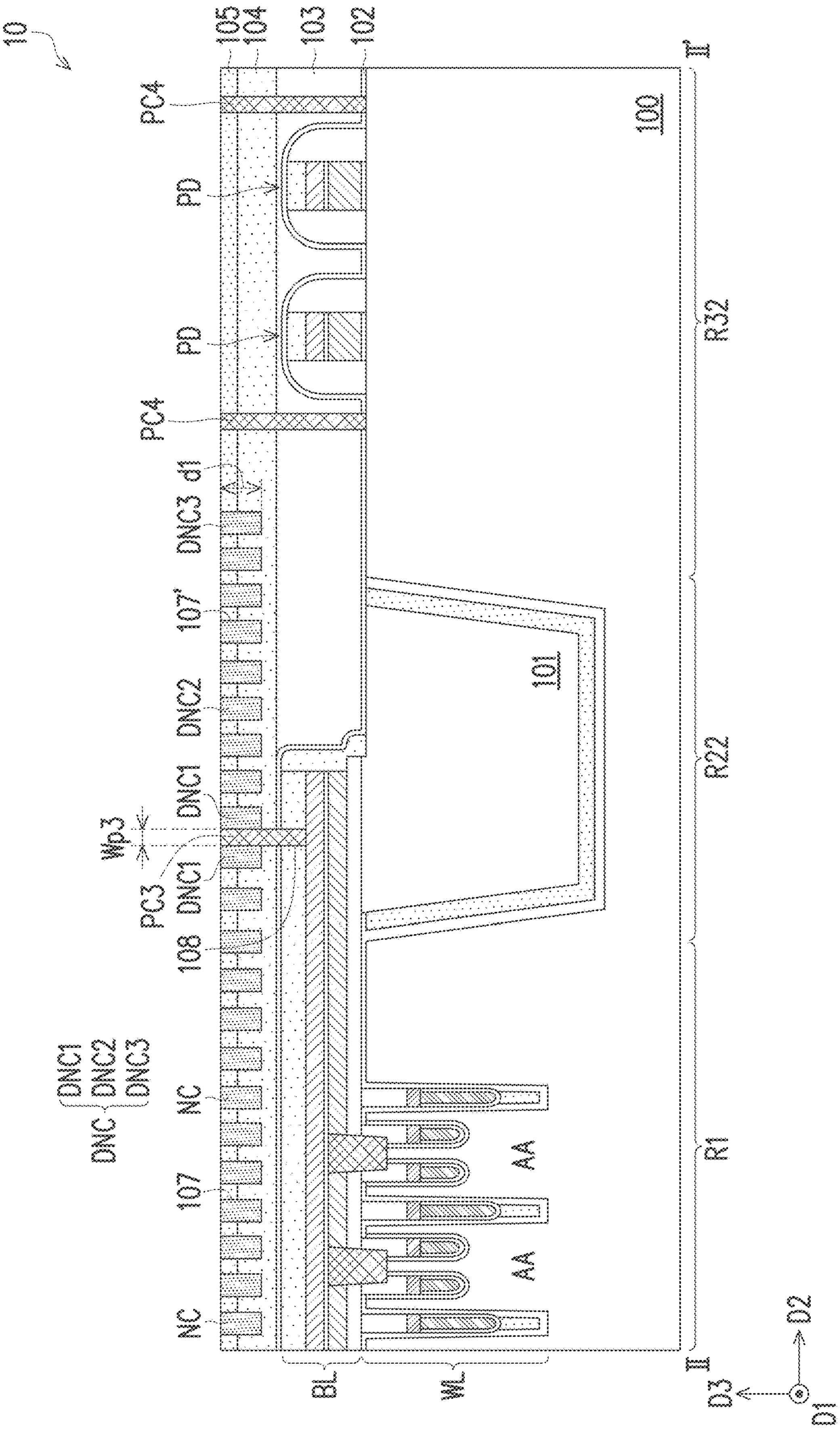
FIG. 2 is a cross-sectional view along line II-II' of FIG. 1.
Figure 3:
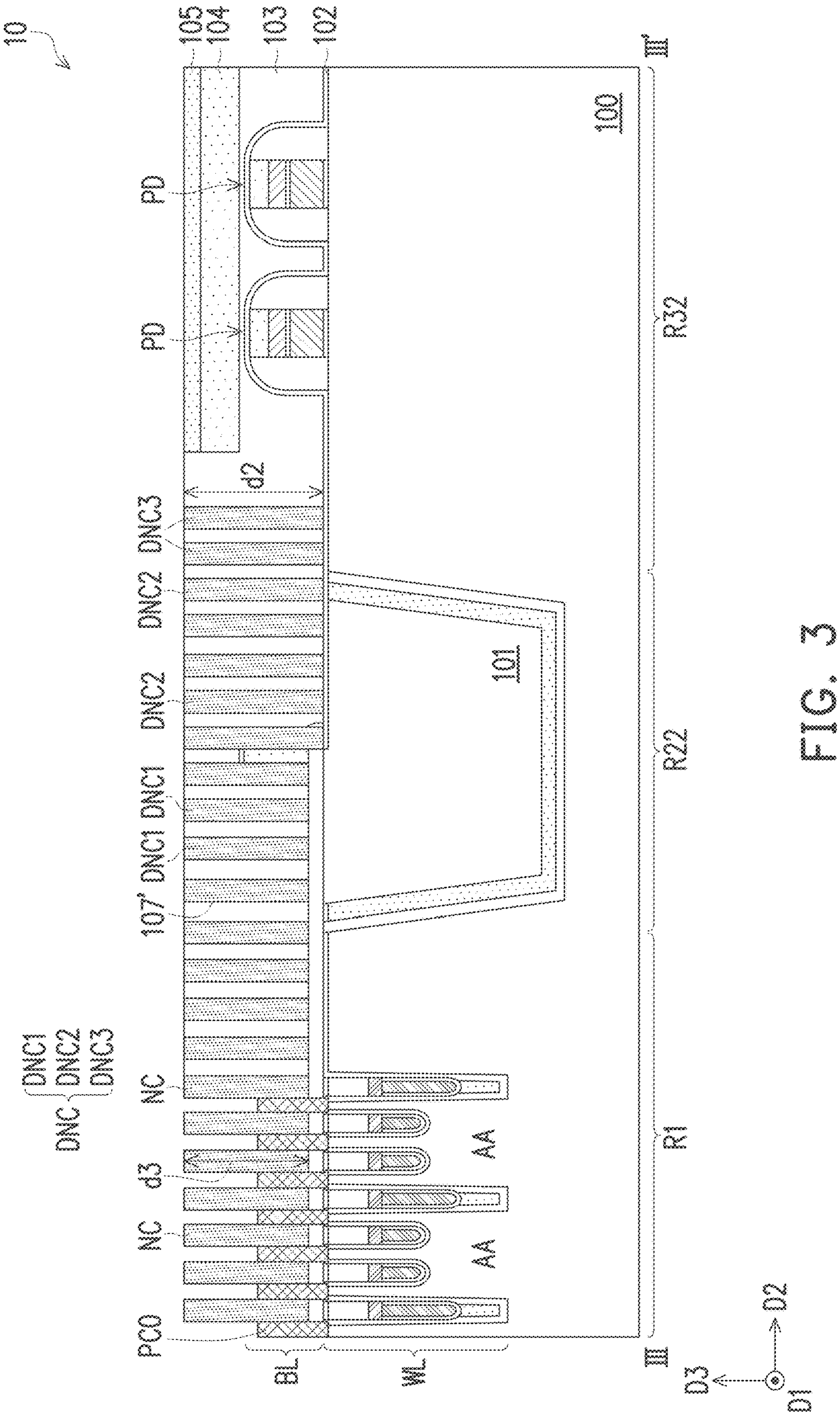
FIG. 3 is a cross-sectional view along line III-III' of FIG. 1.

Referring to FIG. 2, FIG. 2 is a cross-sectional view along line II-II' of FIG. 1. Each of the dummy partition walls DNC and each of the partition walls NC pass through the stop layer 105 and stop at the stop layer 104 without extending into the dielectric layer 103 and have a depth d1. Referring to FIG. 3, FIG. 3 is a cross-sectional view along line III-III' of FIG. 1. Each of the dummy partition walls DNC and each of the partition walls NC further extend from a top surface to a bottom surface of the dielectric layer 103 and have a depth d2. The partition walls NC and some of the partition walls DNC are located above the substrate 100. There are other partition walls DNC located above the isolation structure 101 in the transition region R22. Each of the dummy partition walls DNC and each of the partition walls NC respectively have at least two different depths d1 and d2 or d1 and d3.

Referring to FIGS. 1 to 5, the memory device 10 further includes multiple conductive plugs PC0 located in the array region R1, multiple conductive plugs PC1, multiple conductive plugs PC2, and multiple conductive plugs PC3 located in the transition region R2, and multiple conductive plugs PC4 located in the peripheral region.

Referring to FIG. 3, the conductive plugs PC0 are electrically connected to an active region AA of the array region R1.

Figure 5:
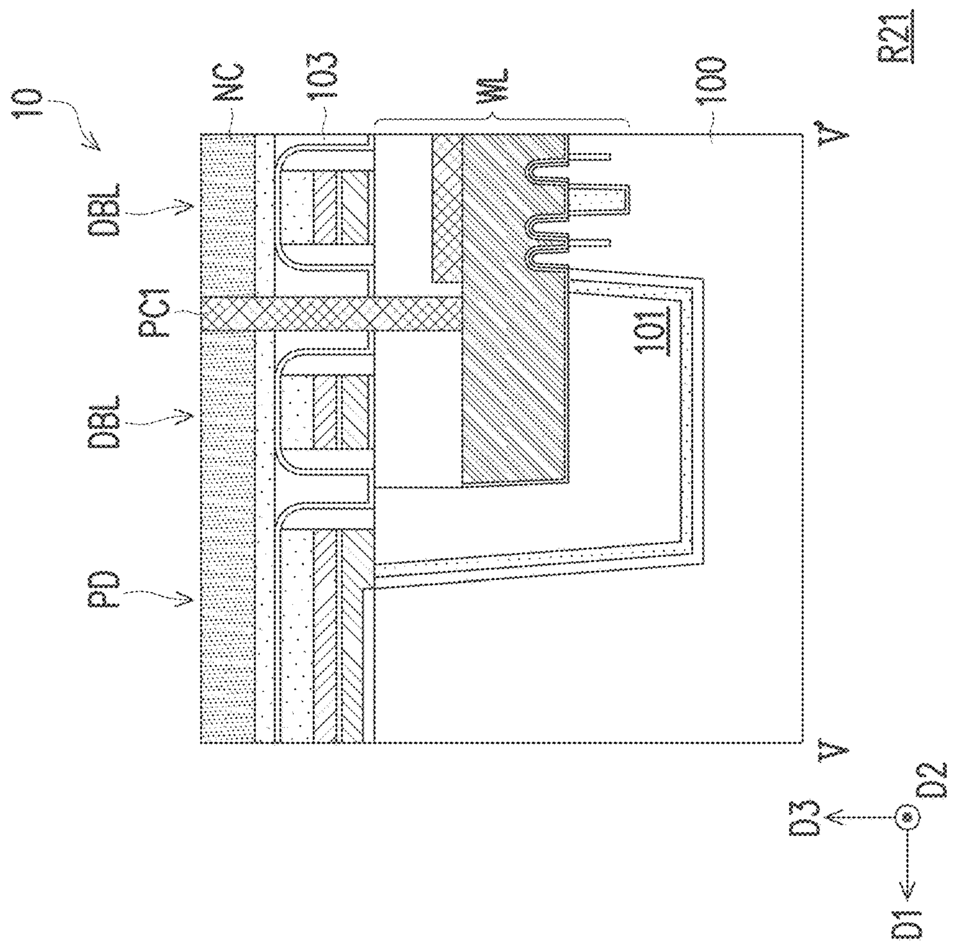
FIG. 5 is a cross-sectional view along line V-V' of FIG. 1.
Figure 4:
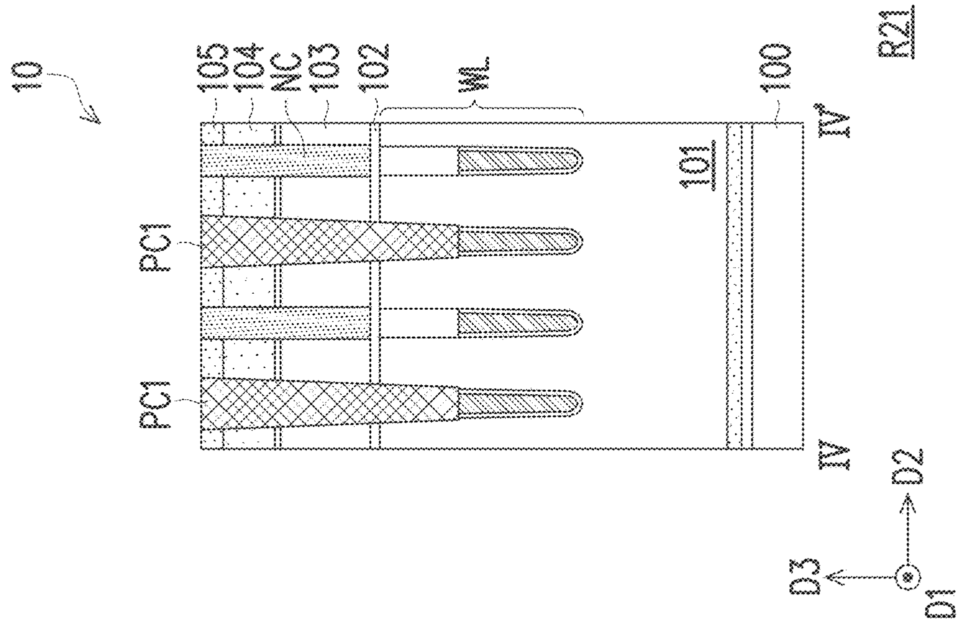
FIG. 4 is a cross-sectional view along line IV-IV' of FIG. 1.

Referring to FIGS. 1, 4, and 5, the conductive plugs PC1 are located in the transition region R21. Each of the conductive plugs PC1 is located between two adjacent ones of the dummy bit line structures DBL, extends through the partition walls NC, and extends downward to be electrically connected to one of the word line structures WL. Referring to FIG. 1, the conductive plugs PC2 are located in the transition region R21. Each of the conductive plugs PC2 is disposed between the adjacent dummy bit line structures DBL and the bit line structures BL, extends through the partition walls NC, and is electrically connected to another one of the word line structures WL (not shown). In an embodiment, the conductive plugs PC1 are electrically connected to multiple odd-numbered word line structures WL of the word line structures WL respectively. The conductive plugs PC2 are electrically connected to multiple even-numbered word line structures WL of the word line structures WL respectively. Multiple widths Wp1 of the conductive plugs PC1 and multiple widths Wp2 of the conductive plugs PC2 may be greater than or equal to the width Wn of the partition walls NC.

Referring to FIGS. 1 and 2, the conducive plugs PC3 are located in the transition region R22. Each of the plurality of conductive plugs PC3 is disposed between two adjacent ones of the first dummy partition walls DNC1 and is electrically connected to an end of one of the bit line structures BL. A length Lp3 of the conductive plugs PC3 may be greater than or equal to the width Wb of the bit lines.

Figure 6A:
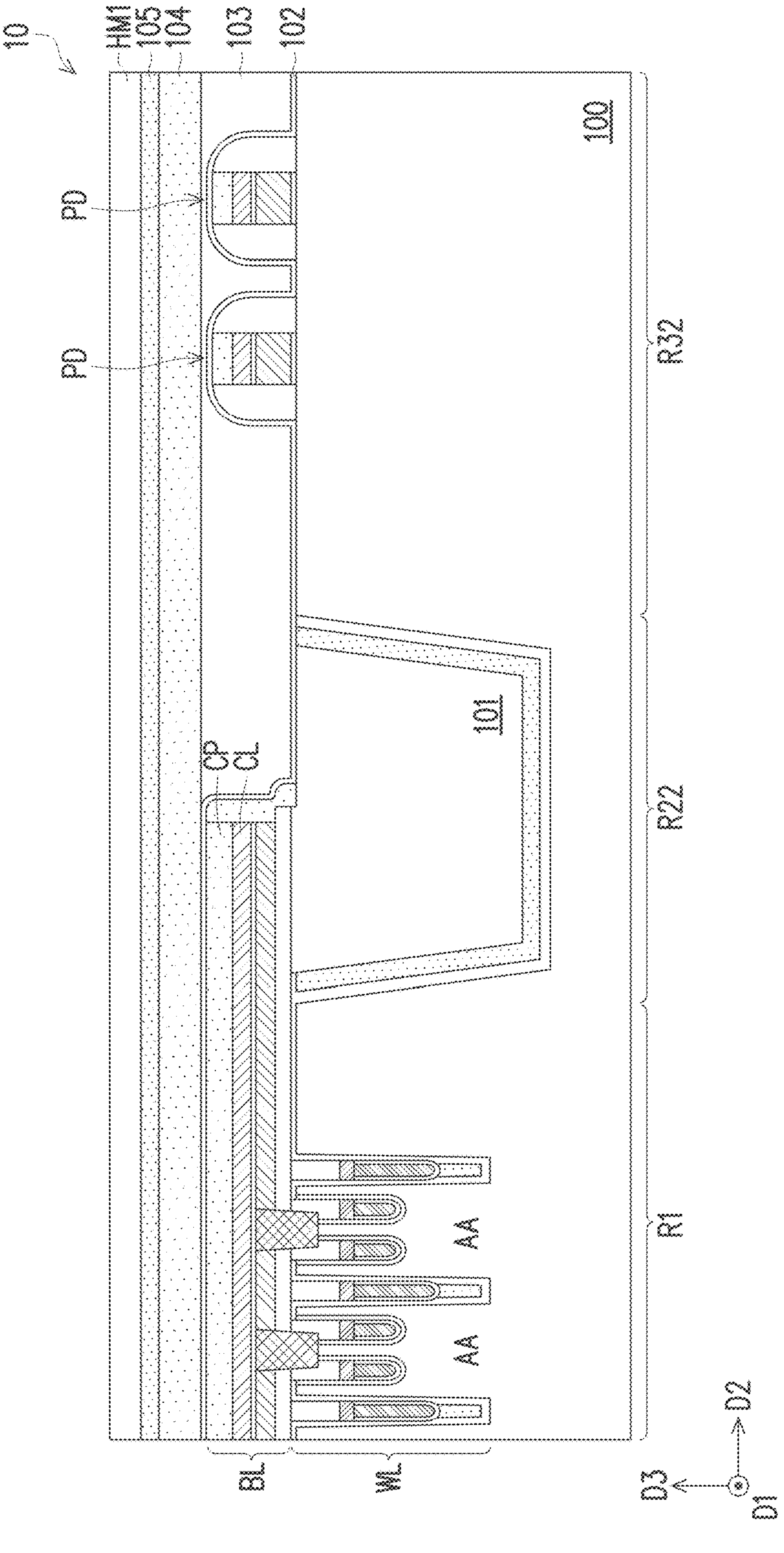
FIGS. 6A to 6E are cross-sectional views of a fabricating process of a memory device according to an embodiment of the disclosure.

Referring to FIG. 6A, the substrate 100 is provided. The substrate 100 includes a semiconductor, such as silicon. The isolation structure 101 is formed in the substrate 100 to define the active region AA. The word line structure WL is formed in the active region AA of the substrate 100. The word line structure WL may include multiple layers, such as a metal layer, a barrier layer, a gate dielectric layer, a cap layer, a hard mask layer, etc.

The bit line structure BL, the dummy bit line structure DBL (shown in FIG. 1), and the peripheral device PD are formed on the substrate 100. Next, the stop layer 102, the dielectric layer 103, the stop layers 104 and 105, and a hard mask layer HM1 are formed on the substrate 100. The stop layer 102, the stop layers 104 and 105, and a cap layer CP of the bit line structure BL are, for example, silicon nitride; the dielectric layer 103 and the hard mask layer HM1 are, for example, silicon oxide.

Figure 6B:
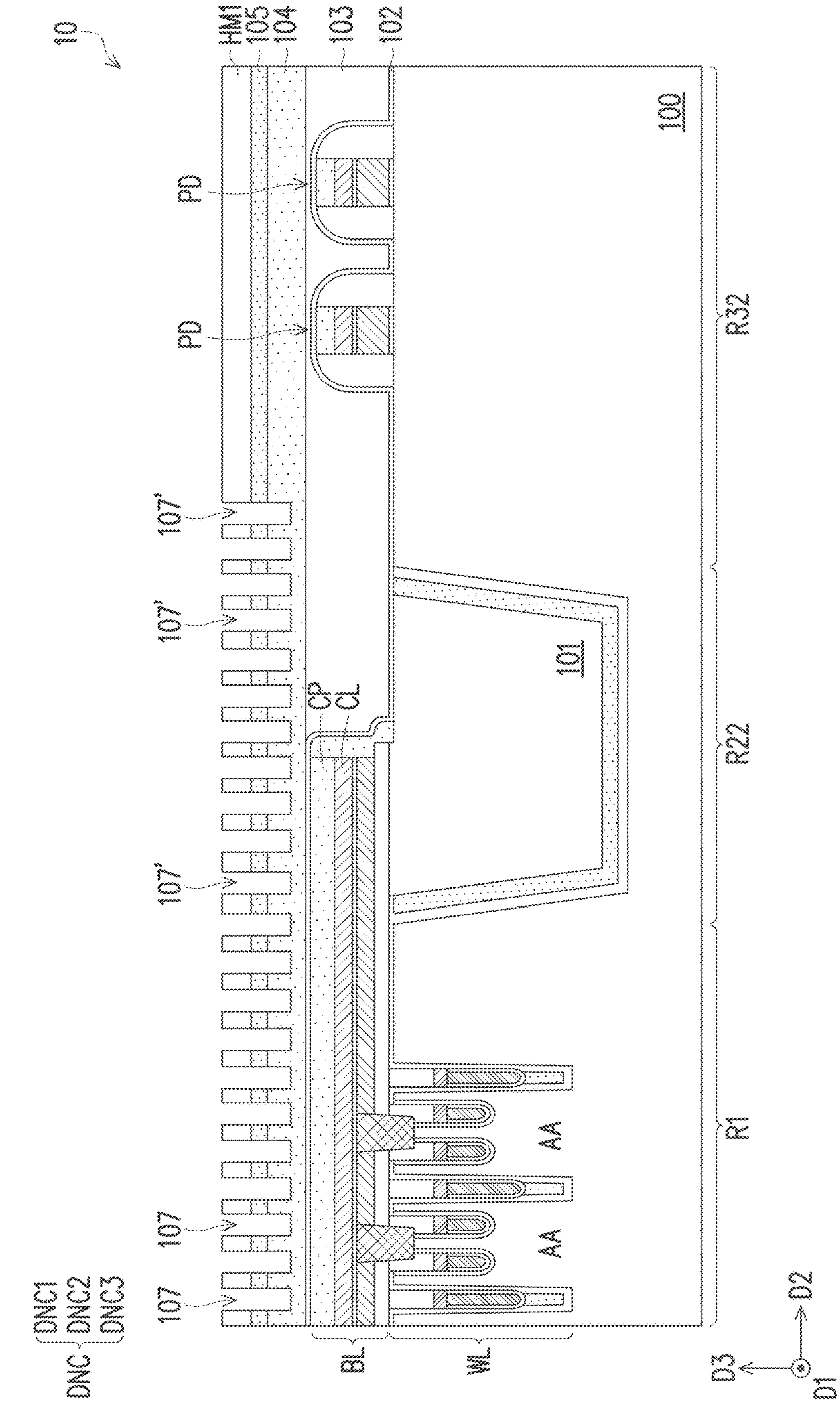

Referring to FIG. 6B, the hard mask layer HM1 and the stop layers 105 and 104 are patterned to form multiple trenches 107 and multiple dummy trenches 107'. In another cross-sectional view, the trenches 107 and the dummy trenches 107' further extend into the dielectric layer 103 (not shown).

Figure 6C:
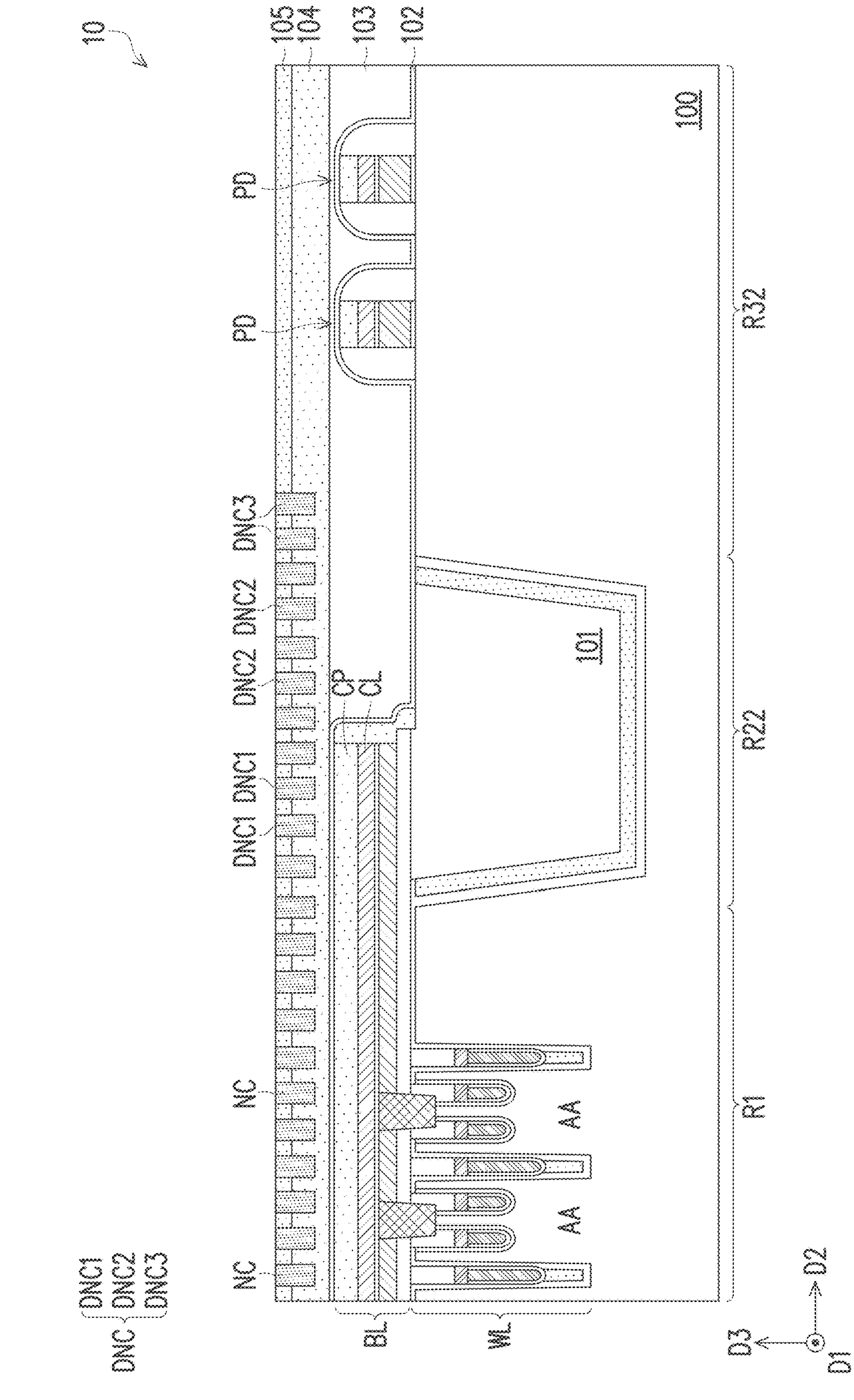

Referring to FIG. 6C, dielectric material is filled into the trenches 107 and the dummy trenches 107' to form the partition walls NC and the dummy partition walls DNC. Afterwards, a chemical mechanical polishing process is performed to remove the hard mask layer HM1 so that top surfaces of the partition walls NC and the dummy partition walls DNC are coplanar with the top surface of the stop layer 105.

Figure 6D:
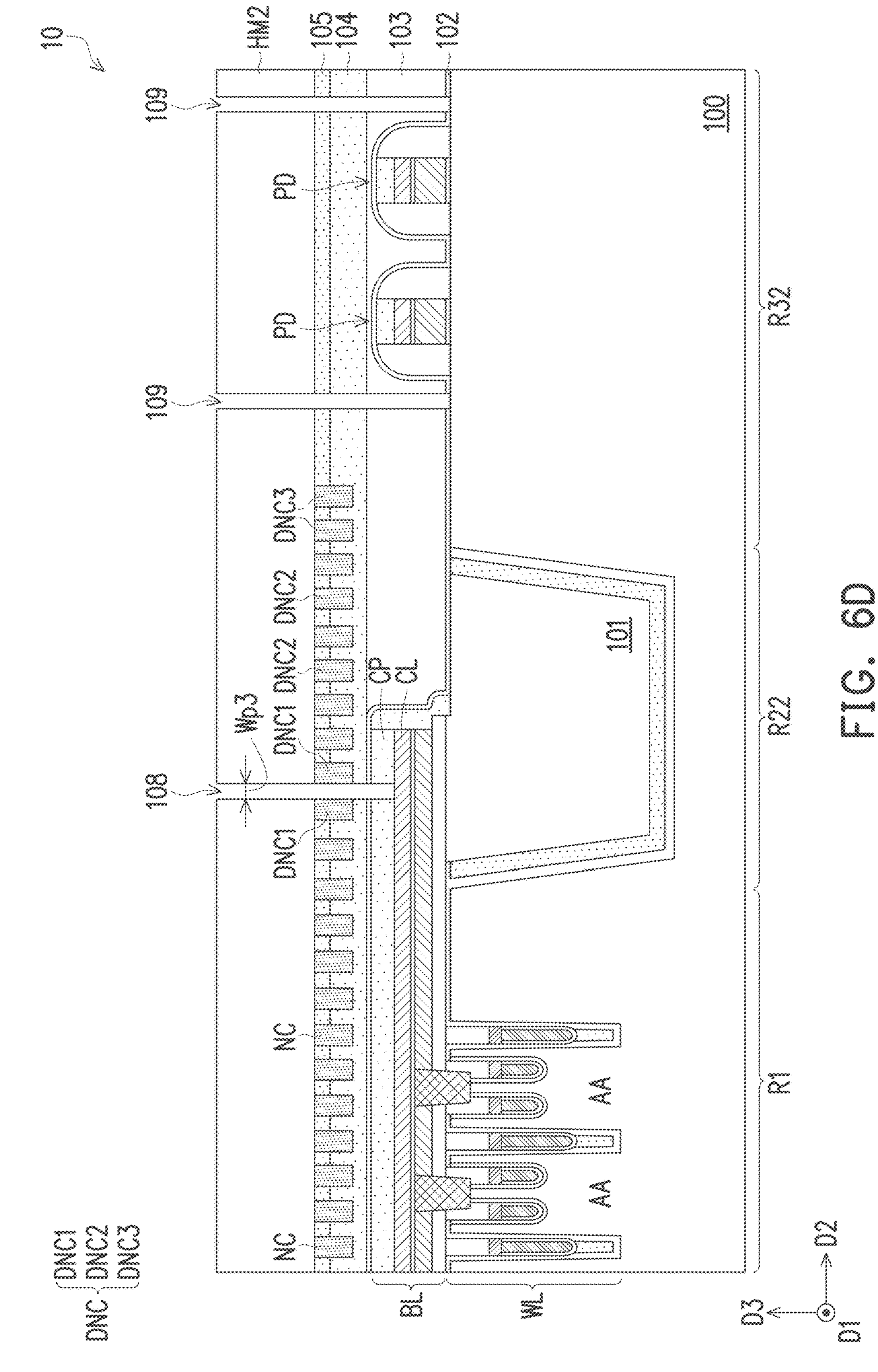

Referring to FIG. 6D, a hard mask layer HM2 is formed on the substrate 100. The hard mask layer HM2 may be a single layer or multiple layers, such as a carbon layer and a silicon oxynitride layer. Next, a patterning process is performed to form conductive plug openings 108 and 109. Since the materials of the dummy partition walls DNC are different from the materials of the hard mask layer HM2, the stop layers 105 and 104, and the cap layer CP of the bit line structure BL, when forming the conductive plug opening 108, the etching agent may self-align and etch the stop layers 105 and 104 between the dummy partition walls DNC and the cap layer CP of the bit line structure BL to form the conductive plug opening 108 exposing a conductive layer CL of the bit line structure BL.

After that, a cleaning process is carried out. Since the material of the dummy partition walls DNC is different from the material of the dielectric layer 103, the dummy partition walls DNC may prevent the conductive plug opening 108 from expanding in the direction D2 and maintain at the width Wp3 during the cleaning process.

That is to say, compared to the situation without multiple dummy partition walls DNC, where the conductive plug openings expand in both directions D1 and D2 during the cleaning process, the disclosure may limit the width Wp3 of the conductive plug opening 108 in the direction D2 through disposing the dummy partition walls DNC. Therefore, after the cleaning process, almost only the length of the conductive plug opening 108 in the direction D1 is slightly expanded to the length Lp3 (shown in FIG. 1).

Figure 6E:
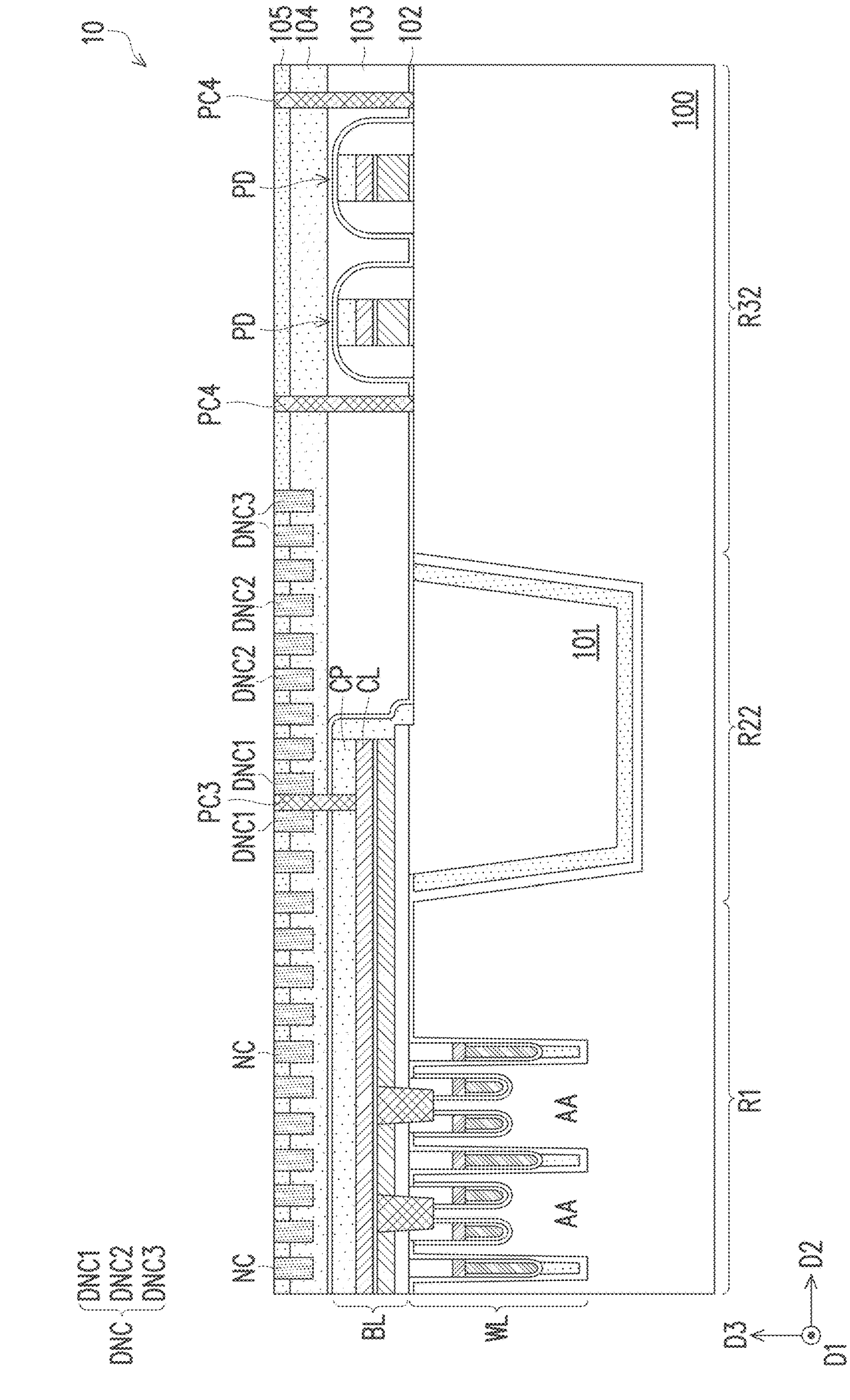

Referring to FIG. 6E, the conductive material is formed within the conductive plug openings 108 and 109 to form the conductive plugs PC3 and PC4. The conductive plug PC3 is electrically connected to the end of the conductive layer CL of the bit line structure BL on the transition region R22. The conductive plug PC4 is electrically connected to the peripheral device PD of the peripheral region R32. Afterwards, the hard mask layer HM2 is removed to expose the stop layer 105.

Referring to FIG. 1, similarly, in the embodiment of the disclosure, after a conductive plug opening 110 of the conductive plug PC1 is formed, during the cleaning process, the dummy bit line structure DBL may be used to limit a length Lp1 in the direction D1. The width of the conductive plug opening 110 in the direction D2 may be slightly expanded to the width Wp1. Compared with the situation without multiple dummy partition walls DNC, where the conductive plug openings expand in both directions D1 and D2 during the cleaning process, the disclosure may limit the length Lp1 of the conductive plug opening 110 in the direction D1 through disposing the dummy bit line structure DBL. Therefore, after the cleaning process, almost only the width of the conductive plug opening 108 in the direction D2 is slightly expanded to the width Wp1. The situation of the conductive plug PC2 is similar to the situation of the conductive plug PC1, which is not be repeated herein.

Therefore, the embodiments of the disclosure can prevent the conductive plug openings from excessive expansion during the cleaning process and avoid abnormal bridging of adjacent conductive plugs through the provision of the dummy partition walls and the dummy bit line structures.

What is claimed is:

1. A memory device comprising:

a substrate, comprising an array region, a peripheral region, and a transition region, wherein the transition region is located between the array region and the peripheral region;

a plurality of word line structures, disposed in the substrate and extending along a first direction from the array region to the transition region;

a plurality of bit line structures, disposed above the substrate and extending along a second direction from the array region to the transition region;

a plurality of dummy bit line structures, disposed above the substrate of the transition region, adjacent to the plurality of bit line structures, and extending along the second direction;

a plurality of partition walls, disposed above the plurality of bit line structures and the plurality of dummy bit line structures, extending along the first direction from the array region to the transition region; and a plurality of first conductive plugs, located in the transition region, wherein each of the first plurality of conductive plugs is disposed between two adjacent ones of the plurality of dummy bit line structures, extends through the plurality of partition walls, and is electrically connected to one of the plurality of word line structures.

2. The memory device according to claim 1, further comprising:

a plurality of second conductive plugs, located in the transition region, wherein each of the second plurality of conductive plugs is disposed between adjacent one of the plurality of dummy bit line structures and one of the plurality of bit line structures, extends through the plurality of partition walls, and is electrically connected to another one of the plurality of word line structures.

3. The memory device according to claim 2, wherein:

the plurality of the first conductive plugs are electrically connected to a plurality of odd-numbered word line structures of the plurality of word line structures respectively; and the plurality of the second conductive plugs are electrically connected to a plurality of even-numbered word line structures of the plurality of word line structures respectively.

4. The memory device according to claim 1, wherein at least one dummy bit line structure of the plurality of dummy bit line structures is disposed above an isolation structure in the substrate.

5. The memory device according to claim 1, wherein the plurality of dummy bit line structures have the same composition structure as the plurality of bit line structures.

6. The memory device according to claim 1, further comprising:

a dielectric layer, located on the substrate; and a plurality of dummy partition walls, extending in the dielectric layer along the first direction.

7. A memory device, comprising:

a substrate, comprising an array region, a peripheral region, and a transition region, wherein the transition region is located between the array region and the peripheral region;

a plurality of word line structures, disposed in the substrate and extending along a first direction from the array region to the transition region;

a dielectric layer, disposed above the substrate;

a plurality of bit line structures, disposed in the dielectric layer and extending along a second direction from the array region to the transition region;

a plurality of partition walls, disposed above the plurality of bit line structures and in the dielectric layer, and extending along the first direction from the array region to the transition region;

a plurality of dummy partition walls, extending along the first direction, covering at least ends of the plurality of bit line structures, and located in the dielectric layer; and a plurality of conductive plugs, located between the adjacent dummy partition walls, wherein each of the plurality of conductive plugs is electrically connected to one of the plurality of bit line structures.

8. The memory device according to claim 7, wherein a material of the plurality of dummy partition walls is the same as a material of the plurality of partition walls and different from a material of the dielectric layer.

9. The memory device according to claim 7, wherein the plurality of dummy partition walls comprises a plurality of first dummy partition walls located in the transition region, covering the ends of the plurality of bit line structures.

10. The memory device according to claim 9, wherein the plurality of dummy partition walls further comprise a plurality of second dummy partition walls disposed in the transition region between the plurality of first dummy partition walls and the peripheral region.

11. The memory device according to claim 10, wherein the plurality of second dummy partition walls are located above an isolation structure in the substrate.

12. The memory device according to claim 11, wherein the plurality of dummy partition walls further comprise a plurality of third dummy partition walls disposed in the dielectric layer of the peripheral circuit region adjacent to the transition region.

13. A method of fabricating a memory device, comprising:

providing a substrate, wherein the substrate comprises an array region, a peripheral region, and a transition region, and the transition region is located between the array region and the peripheral region;

forming a plurality of word line structures in the substrate, wherein the plurality of word line structures extends along a first direction from the array region to the transition region;

forming a dielectric layer on the substrate;

forming a plurality of bit line structures in the dielectric layer, wherein the plurality of bit line structures extends along a second direction from the array region to the transition region;

forming a plurality of partition walls above the plurality of bit line structures and in the dielectric layer, wherein the plurality of partition walls extend along the first direction from the array region to the transition region;

forming a plurality of dummy partition walls in the dielectric layer, wherein the plurality of dummy partition walls extend along the first direction and cover at least ends of the plurality of bit line structures;

forming a plurality of conductive plug openings in the dielectric layer between the plurality of adjacent dummy partition walls; and forming a plurality of conductive plugs in the plurality of conductive plug openings, wherein each of the plurality of conductive plugs is electrically connected to one of the plurality of bit line structures.

14. The method of fabricating a memory device according to claim 13, wherein a material of the plurality of dummy partition walls is the same as a material of the plurality of partition walls and different from a material of the dielectric layer.

15. The method of fabricating a memory device according to claim 13, wherein forming the plurality of dummy partition walls comprises forming a plurality of first dummy partition walls covering the ends of the plurality of bit line structures.

16. The method of fabricating a memory device according to claim 13, wherein forming the plurality of dummy partition walls comprises forming a plurality of second dummy partition walls disposed between a plurality of first dummy partition walls and the peripheral region.

17. The method of fabricating a memory device according to claim 13, wherein forming the plurality of dummy partition walls comprises forming a plurality of second dummy partition walls, and the plurality of second dummy partition walls are located above an isolation structure in the substrate of the transition region.

18. The method of fabricating a memory device according to claim 13, wherein forming the plurality of dummy partition walls comprises forming a plurality of third dummy partition walls in the dielectric layer of the peripheral circuit region adjacent to the transition region.

* * * * *